PHOTOVOLTAIC CELL AND METHOD OF MAKING THE SAME

Filed Aug. 26, 1966 2 Sheets-Sheet 1

INVENTORS
NOBUO NAKAYAMA
KAZUFUMI YAMAGUCHI
EIICHI HIROTA

BY Wenderoth, Lind & Ponack
ATTORNEYS

PHOTOVOLTAIC CELL AND METHOD OF MAKING THE SAME

Filed Aug. 26, 1966 2 Sheets-Sheet 2

INVENTORS
NOBUO NAKAYAMA
KAZUFUMI YAMAGUCHI
EIICHI HIROTA
BY Wenderoth, Lind & Ponack,
ATTORNEYS

United States Patent Office 3,492,167

Patented Jan. 27, 1970

3,492,167

PHOTOVOLTAIC CELL AND METHOD OF MAKING THE SAME

Nobuo Nakayama, Hirakata-shi, Kazufumi Yamaguchi, Yao-shi, and Eiichi Hirota, Sakai-shi, Japan, assignors to Matsushita Electric Industrial Co., Ltd., Osaka, Japan Filed Aug. 26, 1966, Ser. No. 575,459
Int. Cl. H01m *15/02, 29/00;* C23b *5/10*
U.S. Cl. 136—89 7 Claims

ABSTRACT OF THE DISCLOSURE

A photovoltaic cell and a method of making it. The cell has an n-type cadmium sulfide sintered plate with an electrochemically deposited p-type thin layer on one surface thereof. The layer is a CdS-like structure with an accompanying copper sulfide structure. Electrodes are applied to the opposite faces of the cell. The cell is made by applying a D.C. current across the sintered plate as a cathode with an anodic copper electrode in an aqueous solution of cupric sulfate.

This invention relates to a novel p-n junction semiconductor element for use in a photovoltaic cell, in an electroluminescent element, in a rectifier and the like. It also relates to a method of preparation of said semiconductor element.

More specifically, the invention relates to a novel, highly efficient, simply-manufactured photovoltaic cell which is usefully employed in power space vehicles; telephone systems; transistorized radio receivers and transmitters; transistorized test equipment and control circuits; charge storage batteries and energy storage capacitors; etc.

As is well known, a semiconductor p-n junction produces a highly efficient photovoltaic device. The silicon p-n junction photovoltaic cell, in particular, is the most efficient device ever developed for converting the energy of sunlight into electricity. The silicon cell, however, is expensive and unstable with high temperatures, humidity and intense radiation. Recently much attention has therefore been paid to other types of photovoltaic cell elements comprising compound-semiconductors such as gallium arsenide, cadmium sulfide, lead sulfide, etc. Especially, II–VI compound-semiconductors (copper doped) have been of interest for this purpose.

The literature has disclosed several methods for making photovoltaic cells comprising such compound-semiconductors:

(1) A copper electrode is applied to one surface of an n-type cadmium sulfide single crystal by an electro-plating process (Richard Williams and Richard H. Bube, Photoemission in Photovoltaic Effect in Cadmium Sulfide Crystals, J. Appl. Phys. 31 968 [1960]);

(2) An n-type cadmium sulfide thin film is prepared by a vacuum-evaporation method and is provided with a copper film by a vacuum-evaporation method. The integrated films are heated at 600° C. to 700° C. in an inert gas so as to form a p-n junction at the interface thereof. (H. G. Grimmeiss and R. Memming, A p-n Photovoltaic Effect in CdS, J. Appl. Phys. 33 2217 [1962]);

(3) A CdTe film is chemically deposited on a glass substrate and is immersed in warm cuprous solution to form a $Cu_{2-x}Te$ thin layer on the CdTe film surface. (D. A. Cusano, CdTe Solar Cells and Photovoltaic Heterojunction in II–VI compounds, Solid State Electronics 6, 217 [1963].)

In addition, various publications have disclosed the possibility of making a photovoltaic cell comprising a CdS single crystal. However, the single crystal is not desirable because of its high cost and the difficulty in controlling the size and form thereof.

The thin films prepared by a vacuum-deposition or vapor-deposition technique are not satisfactorily adaptable for a photovoltaic cell because it is difficult to control the composition of deposited films and to produce resultant cells having a high tolerance in performance.

A serious problem is that prior cells comprising II–VI compound semiconductors are of a poorer mechanical strength and a lower efficiency in the photovoltaic cell than a silicon p-n junction cell.

Therefore, it is a principal object of this invention to provide a photovoltaic cell element characterized by a high efficiency, a low cost and a high mechanical strength.

It is further an object of this invention to provide a photovoltaic cell comprising a cadmium sulfide sintered body which is fabricated easily into a desired shape and size.

It is another object of this invention to provide a method for making a photovoltaic cell by an electromechanical process characterized by a high efficiency in photovoltaic effect and by a simple procedure.

More details of the invention will be apparent from the following description taken together with the accompanying drawings in which.

Figure 1:
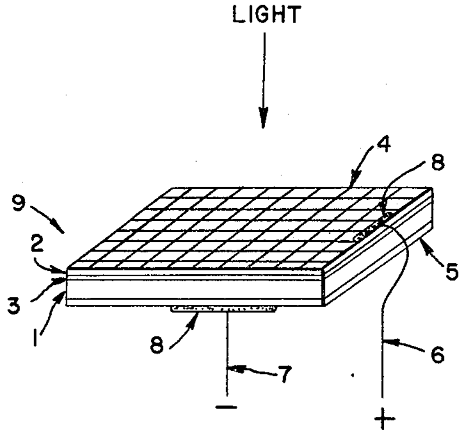
FIG. 1 is a perspective view of a photovoltaic cell according to the invention.

Various methods for making a p-n junction on an n-type cadmium sulfide are known; cf. literature cited supra.

According to the present invention, an n-type cadmium sulfide sintered body forms a p-n junction on the surface thereof when a D.C. voltage is applied across said sintered body as a cathode and a copper block as an anode in an aqueous solution of cupric sulfate. Said n-type cadmium sulfide body as sintered is of a light brown color. Said sintered body treated electrochemically in the above way shows a silver-gray color at the surface. Fluorescent X-ray analysis indicates that the silver-gray colored surface consists of cadmium, copper and sulfur. An X-ray diffraction pattern obtained from the silver-gray colored surface adhered to the sintered body shows no metallic copper phase but shows a CdS-like structure phase. There exists a copper sulfide phase in the silver-gray colored surface, which is rubbed off. Therefore, the silver-gray colored surface consists of cadmium, copper and sulfur and exists in a CdS-like crystal structure accompanied by a copper sulfide structure. The thermoelectric power and Hall coefficient measurement confirms that the silver-gray colored surface layer exists as a p-type semiconductor and said n-type cadmium sulfide sintered body forms a p-n junction combined with said silver-gray colored surface layer. Formation of the p-n junction on the surface of said sintered body treated electrochemically is further confirmed by a photovoltaic effect.

Before proceeding with a detailed description of the novel photovoltaic cell and its preparation according to the invention, its construction and efficiency in photovoltaic effect will be explained with reference to FIGS. 1 and 2 of the drawings wherein reference character 9 designates, as a whole, a photovoltaic cell comprising, as its active element, an n-type cadmium sulfide sintered body 1 treated electrochemically so as to produce a photovoltaic effect.

Said sintered body 1 is electrochemically treated, so as to produce a p-type layer 2 on a surface thereof and to form a p-n junction 3 in a manner hereinafter set forth, and is provided with a pair of electrodes 4 and 5 in an ohmic contact, applied in a suitable and per se conventional manner, on two opposed surfaces thereof. Wire leads 6 and 7 are attached conductively to the electrodes 4 and 5, respectively, by means of solder 8. When the cell is irradiated by an incident light at the surface treated electrochemically, it generates electric power. The photovoltaic effect is measured by an efficiency defined by a percentage of the energy of the irradiated sunlight having 100 mw./cm.$^2$ relative to the generated electric power in a per se well known manner and is evaluated conveniently by a combination of the generated voltage in an open circuit and the flowing current in a short circuit of the cell illuradiated with sunlight having 100 mw./cm.$^2$.

Figure 2:
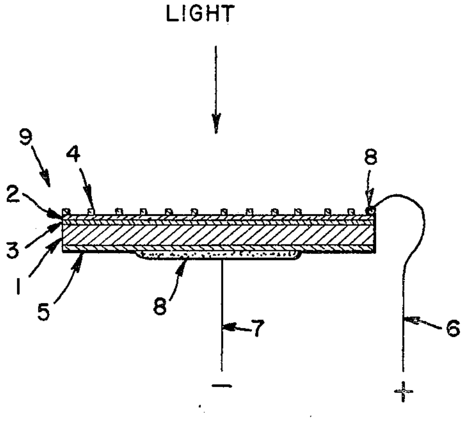
FIG. 2 is a cross-sectional view through the photovoltaic cell illustrated in FIG. 1.

It has been discovered according to this invention that the photovoltaic effect of the cell defined in FIGS. 1 and 2 is strongly influenced by various conditions of the electrochemical process, such as concentration of aqueous solution of cupric sulfate, applied current density, temperature of the aqueous solution, and treating period.

The most important factor is the current density during the electrochemical treatment. No photovoltaic effect is observed with a D.C. current density higher than 5 ma./cm.$^2$. Operable current density is from 0.05 to 5.0 ma./cm.$^2$ in accordance with the invention. The usual copper plating is preferably carried out with a bath composition comprising cupric sulfate and added hydrogen sulfate ($H_2SO_4$) in a small amount. The addition of hydrogen sulfate, however, results in a poor photovoltaic effect of the resultant cell. Best current density is 0.1 to 1.0 ma./cm.$^2$ regardless of other operable conditions of the electrochemical process.

It is also of importance that the concentration of the aqueous solution of cupric sulfate is higher than 0.1%. A concentration lower than 0.1% produces an unhomogeneous layer in color and generates no photovoltaic effect in the resultant cell. An aqueous solution saturated with cupric sulfate is operable. Optimal concentration is 0.5 to 20%.

A bath temperature higher than 60° C. also produces an unhomogenenous layer on the surface of said sintered body. An operable bath temperature is from 0° C. to 60° C.

The treating period also has an effecet on the photovoltaic effect of the resultant cell. The electrochemical process requires at least 10 minutes for achieving a desirable photovoltaic effect of the resultant cell under any operable conditions of other factors such as current density, bath composition and bath temperature mentioned above. A short period results in a formation of the non-uniform colored p-type thin layer, on the surface of said sintered body. An operable time period is 30 minutes to 3 hours regardless of any other operable conditions.

The operable and optimal conditions for the electrochemical process according to this invention thus involve a combination of various factors as listed in Table I.

TABLE I

| | Operable condition | Optimal condition |
|---|---|---|
| Current density | 0.5 to 5 ma./cm.$^2$ | 0.1 to 1.0 ma./cm. |
| Concentration of aqueous solution of copper sulfate. | >0.1% | 0.5 to 20%. |
| Bath temperature | 0° to 60° C | 0° to 60° C. |
| Treating period | >10 min | 0.5 to 3 hours. |

According to this invention the p-type thin layer so produced has a high response to irradiated light with respect to photovolatic effect even though it has a silver-gray color. This discovery makes it possible to form a novel photovoltaic cell comprising an n-type cadmium sulfide semiconductor and a p-type thin layer, in which the photovoltaic effect can be achieved by illuminating said p-type thin layer as shown in FIGS. 1 and 2.

Therefore it is necessary to control the thickness of said p-type layer. Operable thickness is 1 to 100 microns, optimally 10 to 50 microns, and can be obtained by the aforesaid operable conditions for the electrochemical process in accordance with the invention.

The photovoltaic effect of this novel photovoltaic cell is strongly influenced by the properties of said n-type cadmium sulfide sintered body. It is necessary for achieving an efficiency of photovoltaic effect higher than 3% that the sintered density thereof be higher than 4.6 g./cm.$^3$ and that the electric resistivity be lower than 10 ohm-cm.

The high sintered density and the low electric resistivity can be obtained in accordance with this invention. A cadmium sulfide powder of a chemically pure grade is pressed into a desired form at a pressure of 100 to 1,000 kg./cm.$^2$. A binding material such as water can be used for pressing. The pressed body is fired at a temperature of 750° C. to 900° C. in a flowing inert gas such as argon or nitrogen for several hours. The flowing rate of the inert gas and the amount of oxygen contained therein are required to be controlled for obtaining the necessary values of sintered density and electric resistivity.

The sintered body so produced is an n-type semiconductor having a sintered density higher than 4.6 and an electric resistivity lower than 10 ohm-cm.

It is necessary for achieving a high photovoltaic effect that the sintered body be polished with a fine lapping powder (100 to 4,000 mesh size) and then etched slightly with dilute aqueous solution of HCl in advance of the aforesaid electrochemical process.

The photovoltaic cell according to the invention has a novel construction such that light is irradiated on the cell from a side of said p-type layer as shown in FIGS. 1 and 2. Therefore, an increase in the thickness of the sintered body does not impair the photovoltaic effect but improves the mechanical strength of the resultant cell.

It has been also discovered according to the invention that the photovoltaic effect is improved by heating said sintered body having said p-type thin layer thereon at a temperature of 150° to 250° C. for 1 to 10 minutes in air and then quenching to room temperature (about 15° to about 30° C.). Such a heat-treatment can increase the open-circuit voltage and improve the efficiency of photovoltaic effect.

An electrode in an ohmic contact to the p-type thin layer can be obtained by applying, for example, a silver paint and a vacuum-deposited silver film by a per se well known method. It is desirable to form the electrode in a grid shape as shown in FIGS. 1 and 2 for obtaining a high current from the resultant cell.

The following examples are given to illustrate certain preferred details of the invention, it being understood that the details of the examples are not to be taken as in any way limiting the invention thereto.

EXAMPLE 1

A commercially available reagent grade CdS powder is pressed into a square plate of 30 mm. x 30 mm. and 2.0 mm. thick. The pressed body is fired at 820° C. for 4 hours in flowing $N_2$-gas having a flow rate of 150 cc./min. The obtained sintered plate of CdS is an n-type semiconductor and has an electrical resistivity of 6 Ω-cm. The sintered density is 4.7 g./cm$^3$. The surface of the CdS disc is lapped with lapping powder of 1000 mesh and etched by a dilute HCl solution. The plate is covered with a resin film at one surface for preventing electrochemical attack thereof and is treated by the electrochemical process in a 5% cupric sulfate solution for one hour. D.C. current of 0.1 ma./cm$^2$ is applied across the plate as a cathode and an anodic copper electrode in the solution. The surface of the n-type CdS disc is colored silver-gray, and forms the p-type thin layer in accordance with the invention. The thickness of the p-type material layer is estimated to be 50 microns. The p-type layer so produced is painted with silver electrode in a grid form. The other surface is polished for rubbing the resin film off and then is provided with a Ni-electrode made by electroless plating in a per se known manner.

Figure 3:
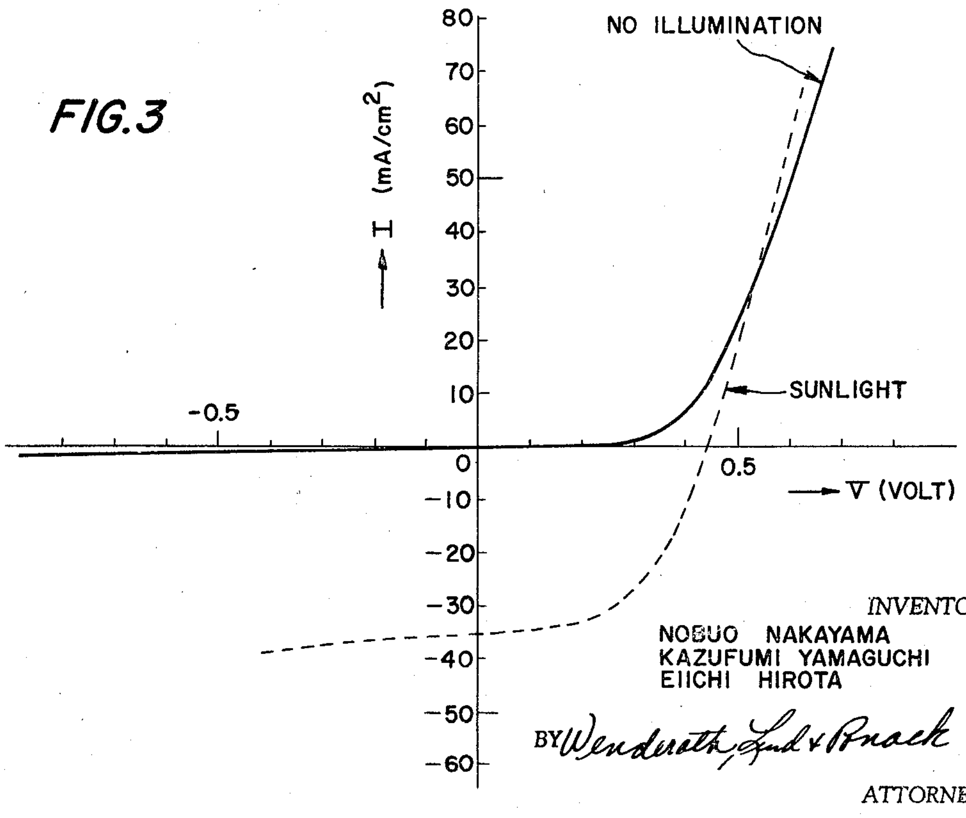
FIG. 3 is a graphical illustration of the voltage versus current characteristic of a photovoltaic cell in accordance with the present invention.

The photovoltaic effect of the resultant cell is illustrated in FIG. 3, wherein the voltage (V) versus current (I) curves are obtained under no-illumination. The photovoltage (Vo) is 0.45 volt and the short-circuit current (Io) is 35 ma./cm.$^2$ at an illuminated sunlight which is extrapolated to have 100 mw./cm.$^2$. The photo-electric conversion efficiency is calculated to be 8.4% with this cell.

EXAMPLE 2

Photovoltaic cells are prepared in a similar way to that of Example 1 except for the sintering conditions of the n-type cadmium sulfide bodies. Table II indicates the effects of sintered density and electric resistivity of the n-type cadmium sulfide body on the photovoltaic effects of the resultant cells. It will be apparent from Table II that a high efficiency of the photovoltaic effect requires an electric resistivity lower than 10 ohm-cm. and a sintered density higher than 4.6 g./cm$^3$. A higher resistivity or a lower sintered density results in a low efficiency. Therefore, the operable sintering temperature is between 750° C. and 900° C.

EXAMPLE 3

Photovoltaic cells are prepared in a similar way to that of Example 1 except for the electrochemical treatments. The cell is a disk type of 20 mm. diameter and 1.5 mm. thick. Table III indicates properties of the photovoltaic cells so produced as a function of various conditions of the electrochemical process. It will be readily understood that the necessary conditions for producing an open circuit higher than 0.4 volt and a short circuit current higher than 10 ma. per unit area are as follows:

(1) The concentration of the cupric sulfate solution is higher than 0.1%.

(2) The applied current density is between 0.05 to 5 ma./cm$^2$.

(3) The treating period is longer than 10 minutes.

(4) The temperature of the cupric sulfate solution is between 0° C. and 60° C.

Figure 4:
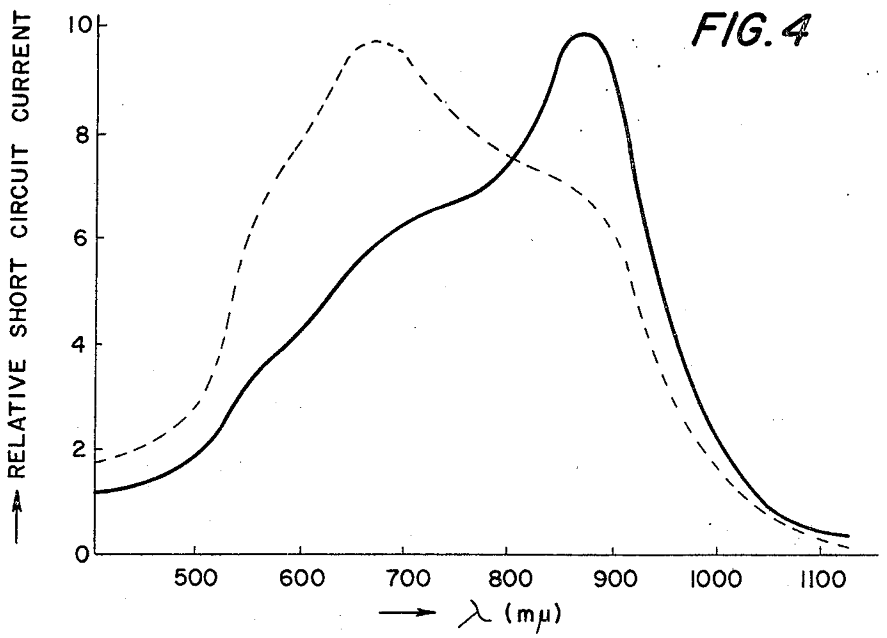
FIG. 4 is a graphic representation of the spectral response of the cell.

The spectral response curves of the cell are also shown in FIG. 4.

EXAMPLE 4

Figure 5:
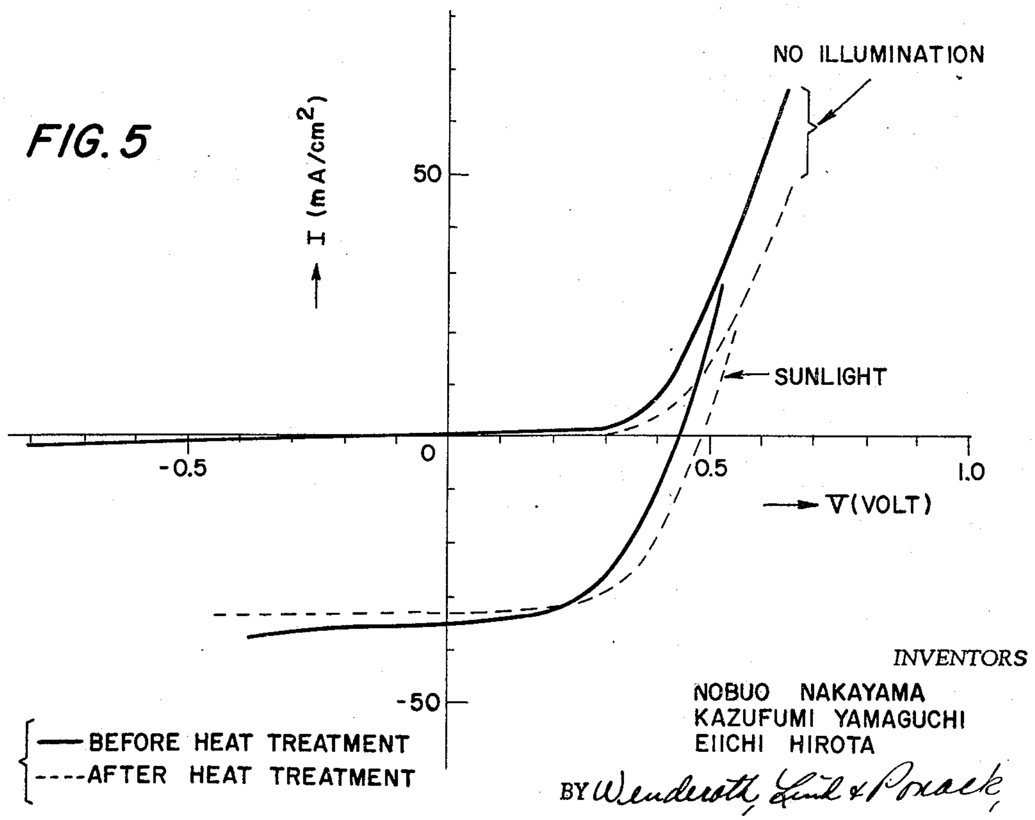
FIG. 5 is a graphic representation of the voltage versus current characteristic of the photovoltaic cell before and after heat-treatment which is carried out for improving the characteristic in accordance with the present invention.

A photovoltaic cell prepared in the same way as that of Example 1 is rapidly heated at 200° C. for 2 minutes and then rapidly cooled to room temperature. The voltage versus current characteristics before and after the heat treatment are shown in FIG. 5. It will be apparent that the open circuit voltage and the efficiency of the photovoltaic effect are improved by this heat-treatment.

TABLE II

| Sample No. | Sintering temperature (° C.) | Electric resistivity (Ω-cm.) | Sintered density (g./cm.$^3$) | Efficiency of photovoltaic effect (percent) |
|---|---|---|---|---|
| 1 | 700 | 120 | 4.32 | 1 |
| 2 | 750 | 100 | 4.60 | 3 |
| 3 | 800 | 7 | 4.70 | 6 |
| 4 | 850 | 1 | 4.70 | 7 |
| 5 | 900 | 0.5 | 5.56 | 4 |
| 6 | 950 | 5 | 4.41 | 1 |
| 7 | 850 | 370 | 4.65 | 1 |
| 8 | 850 | 54 | 4.65 | 3 |
| 9 | 850 | 11 | 4.61 | 3 |

TABLE III

| No. | Condition for electro-chemical treatment | | | | Photovoltaic effect | |
|---|---|---|---|---|---|---|
| | Solution concentration (percent) | Current density (ma./cm.$^2$) | Period (h.) | Temperature (° C.) | Open circuit voltage $V_o$ (volt) | Short circuit current Is (ma./cm.$^2$) |
| 1 | 0.1 | 0.3 | 1 | 25 | 0.47 | 12.6 |
| 2 | 0.5 | 0.3 | 1 | 25 | 0.44 | 30.0 |
| 3 | 5.0 | 0.3 | 1 | 25 | 0.42 | 35.0 |
| 4 | 10.0 | 0.3 | 1 | 25 | 0.44 | 24.2 |
| 5 | Sat. | 0.3 | 1 | 25 | 0.43 | 27.6 |
| 6 | 1 | 0.05 | 1 | 25 | 0.47 | 12.6 |
| 7 | 1 | 0.1 | 1 | 25 | 0.43 | 24.9 |
| 8 | 1 | 1.0 | 1 | 25 | 0.42 | 23.0 |
| 9 | 1 | 5.0 | 1 | 25 | 0.40 | 10.5 |
| 10 | 1.4 | 0.3 | 1 | 0 | 0.40 | 14.2 |
| 11 | 1.4 | 0.3 | 1 | 60 | 0.40 | 10.3 |
| 12 | 1.4 | 0.3 | 1 | 75 | 0.19 | 0.4 |
| 13 | 10 | 0.3 | 0.2 | 25 | 0.40 | 11.45 |
| 14 | 10 | 0.3 | 0.25 | 25 | 0.44 | 12.9 |
| 15 | 10 | 0.3 | 2 | 25 | 0.42 | 28.3 |

What we claim is:

1. A photovoltaic cell of a p-n junction semiconductor comprising an n-type cadmium sulfide sintered plate and an electrochemically deposited p-type thin layer on one surface of said sintered plate, said layer consisting of cadmium, copper and sulfur, and being a CdS-like structure with an accompanying copper sulfide structure, electrodes applied respectively to said p-type thin layer and to another surface of said sintered body, and means to generate a photovoltaic effect when light is irradiated on said p-type thin layer.

2. A photovoltaic cell as defined in claim 1, wherein said n-type cadmium sulfide sintered plate has an electric resistivity lower than 10 ohm-cm. and a sintered density higher than 4.6 g./cm.$^3$ thereof, and said p-type thin layer is in a thickness of 1 to 100 microns.

3. In a method for making a photovoltaic cell which is a p-n junction semiconductor having a n-type cadmium sulfide sintered plate, the improvement which consists of forming a thin p-type layer consisting of cadmium, copper and sulfur, and being a CdS-like structure with an accompanying copper sulfide structure on one surface of said n-type cadmium sulfide sintered plate by an electrochemical treatment in which a D.C. current is applied across said sintered plate as a cathode and an anodic copper electrode with said plate and electrode immersed in an aqueous solution of cupric sulfate.

4. The improvement in making a photovoltaic cell defined in claim 3, wherein said D.C. current density is 0.05 to 5.0 ma./cm.$^2$ and is applied for a time period longer than 10 minutes in said aqueous solution of cupric sulfate having a concentration higher than 0.1% at temperature of 0° to 60° C. so as to produce said p-type thin layer in a thickness of 1.0 to 100$\mu$.

5. The improvement in making a photovoltaic cell defined in claim 3, wherein said D.C. current density is 0.1 to 1.0 ma./cm.$^2$ and is applied for a time period of 30 minutes to 3 hours in said aqueous solution of cupric sulfate having a concentration ranging from 0.5 to 20% at a temperature of 20° to 50° C., so as to produce said p-type thin layer in a thickness of 10 to 50$\mu$.

6. In a method for making a photovoltaic cell which is a p-n junction semiconductor having an n-type cadmium sulfide sintered body, the improvement which comprises polishing one surface of said n-type cadmium sulfide sintered plate having an electric resistivity lower than 10 ohm-cm. and a sintered density higher than 4.6 g./cm.$^3$, etching slightly said surface with an aqueous solution of acid, and forming a p-type thin layer on said surface by an electrochemical treatment in which a D.C. current of from 0.05 to 5.0 ma./cm.$^2$ is applied across said sintered plate as a cathode and an anodic copper electrode with said plate and electrode immersed in an aqueous solution of cupric sulfate.

7. The improvement for making a photovoltaic cell defined in claim 6, wherein said D.C. current density is 0.1 to 1.0 ma./cm$^2$. and is applied for a time period of 30 minutes to 3 hours in said aqueous solution of cupric sulfate having a concentration ranging from 0.5 to 20% at a temperature of 20° to 50° C. so as to produce said p-type thin layer of a thickness of 10 to 50$\mu$.

References Cited

UNITED STATES PATENTS

| | | | |
|---|---|---|---|
| 2,694,040 | 11/1954 | Davis et al. | 204—52 X |
| 2,958,633 | 11/1960 | Claussen | 204—52 X |
| 2,999,240 | 9/1961 | Nicoll. | |
| 3,328,272 | 6/1967 | Sandmann et al. | 204—15 X |
| 2,879,362 | 3/1959 | Meyer | 117—201 |

OTHER REFERENCES

Hammond et al., A Cadmium Sulfide Solar Energy Generator, in WADC publication 56-57, June 1956 (only pp. 1, 2, 17, 18, 22-24).

A. B. CURTIS. Primary Examiner

U.S. Cl. X.R.

204—32, 50, 52